United States Patent
Tseng et al.

(10) Patent No.: US 9,279,841 B2
(45) Date of Patent: Mar. 8, 2016

(54) INTEGRATABLE CAPACITIVE TOUCH SENSING CIRCUIT THROUGH CHARGE SHARING

(71) Applicant: TRITAN TECHNOLOGY INC., Hsinchu (TW)

(72) Inventors: Ching-Hung Tseng, Hsinchu (TW); Jen-An Wang, Hsinchu (TW)

(73) Assignee: TRITAN TECHNOLOGY INC., Hsinchu (TW)

(*) Notice: Subject to any disclaimer, the term of this patent is extended or adjusted under 35 U.S.C. 154(b) by 400 days.

(21) Appl. No.: 13/952,891

(22) Filed: Jul. 29, 2013

(65) Prior Publication Data

US 2015/0028895 A1 Jan. 29, 2015

(51) Int. Cl.
*G01R 27/26* (2006.01)
*G06F 3/044* (2006.01)

(52) U.S. Cl.
CPC ............ *G01R 27/2605* (2013.01); *G06F 3/044* (2013.01)

(58) Field of Classification Search
CPC ............ G06F 3/044; G06F 2203/0338; G06F 3/03547; G06F 3/0416; G01P 15/125; G01R 27/2605; G01D 5/24; G01L 9/0072; G01L 9/12; H03K 2217/960705; H03K 17/962; H03K 17/955
See application file for complete search history.

(56) References Cited

U.S. PATENT DOCUMENTS

| | | | | |
|---|---|---|---|---|
| 8,878,555 B2* | 11/2014 | Huang | ................... | G06F 3/044 324/678 |
| 2014/0176482 A1* | 6/2014 | Wei | ....................... | G06F 3/0418 345/174 |

* cited by examiner

*Primary Examiner* — Alesa Allgood
(74) *Attorney, Agent, or Firm* — Lin & Associates Intellectual Property, Inc.

(57) ABSTRACT

An integratable capacitive touch sensing circuit through charge sharing is provided, including a charge sharing circuit, voltage-controlled oscillator, reference frequency generator, switch clock generator and frequency compare circuit; wherein charge sharing circuit further including a sensing capacitor, touch capacitor, share capacitor, charging switch, charge sharing switch and discharging switch, for sharing charge from charged sensing capacitor with discharged share capacitor through charge sharing to accumulate voltage on share capacitor. The capacitance of share capacitor is adjustable for applications generating different sensing capacitance. The charging switch, charge sharing switch and discharging switch are controlled by non-overlapping clocks. Prolonging close duration of charging switch and minimizing close duration of charge sharing switch and discharging switch can minimize interference from ambient noise. The charge sharing circuit finishes charge sharing in a clock cycle and voltage of share capacitor are linear to sensing capacitance and touch capacitance.

14 Claims, 4 Drawing Sheets

INTEGRATABLE CAPACITIVE TOUCH SENSING CIRCUIT THROUGH CHARGE SHARING

FIELD OF THE INVENTION

The present invention generally relates to a capacitive touch sensing circuit, and more specifically to an integratable capacitive touch sensing circuit through charge sharing.

BACKGROUND OF THE INVENTION

As a variety of 3C products becomes ubiquitous, the demands on touch panel also increase. In general, the touch panel can be categorized as resistive, capacitive, ultrasonic or infrared. The least expensive touch panel in the market is the resistive system, which also has the highest market share. The resistive system uses a standard glass panel, including an upper ITO conductive layer and a lower ITO conductive layer. A spacer is disposed between the two layers and the current can flow between the two layers. When in use, the pressure makes the two ITO conductive layers contact, and the electrical field change is regarded as a touch event. Finally, a signal is transmitted to a controller for processing. The controller senses the voltage change in the panel and computes the touch point.

On the other hand, a capacitive touch panel uses a capacitive sensor, for sensing the capacitive change generated by the static electricity combination between transparent electrodes and human touch so as to detect the coordinates through an induced current of the capacitive change. When a finger touches the touch panel, the current will continuously flow through the sensor so that the sensor can store electrons in both horizontal and vertical directions to form a precisely controlled capacitive field. When the finger touches a different location, the normal capacitive field of the sensor is changed by another capacitive field. At this point, the circuit disposed at each corner of the panel will compute the change of the electrical field and then transmit a signal of the touch event to the controller for processing. Compared to resistive touch panel, the capacitive touch panel shows better performance and more convenient to use. However, because the capacitive touch panel requires a more complicated manufacturing process and the circuit of driving IC is more complex, the cost and the technology development are not suitable for the medium and small size products.

FIG. 1 shows a schematic view of a conventional circuit of using a relaxation oscillator to achieve capacitive sensing. As shown in FIG. 1, a relaxation oscillator 101 charges and discharges a capacitor Cx periodically, wherein the oscillation frequency and the capacitance of capacitor Cx are related to the current for charging and discharging, i.e., CdV=Idt. In the case of constant current, the capacitance change of capacitor Cx will change the frequency of the relaxation oscillator 101. A frequency comparator 103 compares the output frequency Fro of the relaxation oscillator 101 and the reference frequency Fref of a fixed reference clock 102. Because the relaxation oscillator 101 charges and discharges the capacitor Cx and the impedance of Cx is usually high, the Cx in this approach is prone to interference by the ambient noise.

FIG. 2 shows a schematic view of a conventional circuit of using charge transfer to achieve capacitive sensing. As shown in FIG. 2, a charge transfer circuit includes a capacitor Csum, a capacitor Cx, a comparator 201, and three switches S1, S2, S3, connected in the following manner: one end of the capacitor Cx connected through switch S1 to a voltage source VDD and the other end grounded; one end of the capacitor Cx grounded and the other end connected through switch S2 to the end of the capacitor Cx connected to switch S1, the voltage of the capacitor Csum is Vsum; two ends of capacitor Csum connected through switch S3 to each other; the voltage Vsum is outputted to the positive input of the comparator 201 and the inverse input is a reference voltage Vref; and the output of the comparator 201 is Vo.

The operation of the above circuit is described as follows: discharging the capacitor Csum through switch S3 to the ground level; applying a non-overlapping clock to switches S1, S2 to gradually transfer the charge on the capacitor Cx to the capacitor Csum, therefore, the voltage Vsum increasing gradually; when voltage Vsum exceeding reference voltage Vref, the output Vo rising from low level to high level, as shown in FIG. 3; and computing the time Tcf starting from Csum discharging to Vo transition. The higher the capacitance of the capacitor Cx is, the shorter the transition time is. The advantage of the above circuit is to provide better resistance to interference by the ambient noise. The capacitor Cx maintains at a low impedance during charging. During charge transfer, the capacitor Csum has a larger capacitance, which is often at least hundreds of times of the capacitance of the capacitor Cx. Thus, the capacitor Csum is also a low impedance component. Therefore, a better resistance to the RF interference can be obtained when the capacitor Cx maintains at a low impedance. On the other hand, the disadvantage of the above circuit is that the capacitance of the capacitor Csum must be hundreds or thousands of time of the capacitance of the capacitor Cx (for example, a few hundred of pF to nF), therefore, it is difficult to make the circuit as an integrated circuit, i.e., un-integratable. Another disadvantage is the way the charge transfer is conducted. The accumulation of the voltage Vsum is not linear, instead, the relation between the voltage Vsum and the capacitance of the capacitor Cx is an exponential relation. In other words, $$v_{sum} = VDD\left(1 - e^{-N\frac{Cx}{Csum}}\right).$$

It is also less linear to compute the difference of the capacitance of capacitor Cx.

Therefore, it is imperative to address the disadvantage of the above technology.

SUMMARY OF THE INVENTION

The present invention has been made to overcome the above-mentioned drawback of conventional technology. The primary object of the present invention is to provide an integratable capacitive touch sensing circuit through charge sharing, by designing the clock to control the charge and discharge of the share capacitor to reduce the capacitance of the share capacitor to achieve the ability to integrate the circuit.

An embodiment of the present invention is to disclose an integratable capacitive touch sensing circuit through charge sharing, including: a charge sharing circuit, a voltage-controlled oscillator (VCO), a reference frequency generator, a switch clock generator and a frequency compare circuit; wherein the charge sharing circuit further including a sensing capacitor and a share capacitor, and sharing charge from the charged sensing capacitor with the discharged share capacitor through charge sharing to accumulate voltage on the share capacitor; the VCO being coupled to the share capacitor of the charge sharing circuit and generating an output frequency having a linear relation to the capacitance of the sensing capacitor of the charge sharing circuit; the reference frequency generator being to provide a reference voltage; the switch clock generator being coupled VCO and generating non-overlapping switch clocks according to the output of the VCO; and the frequency compare circuit being coupled to the output end of the VCO and the reference frequency provided by the reference frequency generator to count respectively the output frequency of the VCO and the reference frequency; when the output frequency of the VCO changing because of a finger touching, a touch event is detected.

The foregoing and other objects, features, aspects and advantages of the present invention will become better understood from a careful reading of a detailed description provided herein below with appropriate reference to the accompanying drawings.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

Figure 1:
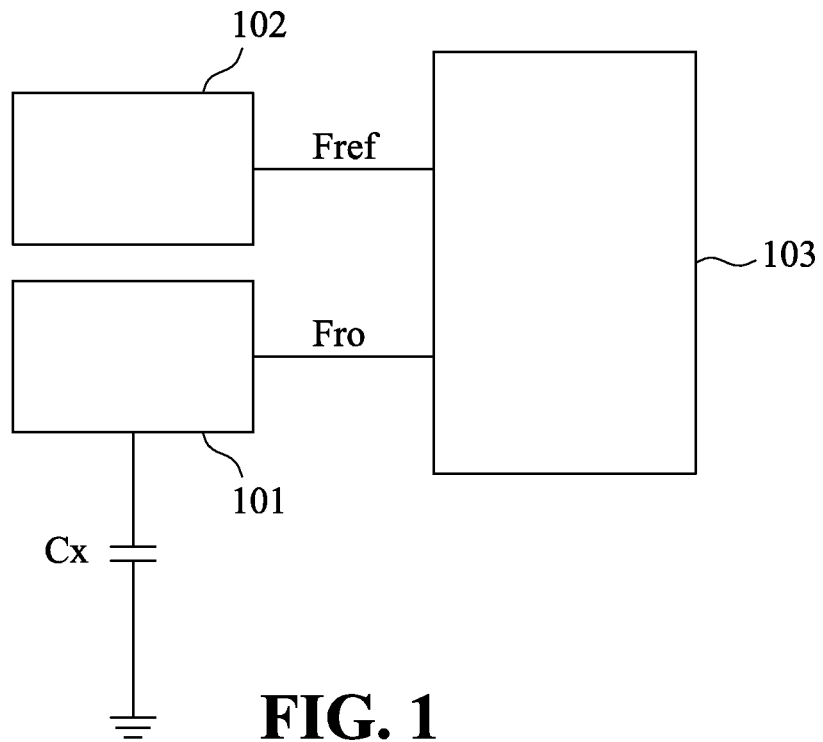
FIG. 1 shows a schematic view of a conventional circuit of using a relaxation oscillator to achieve capacitive sensing.
Figure 2:
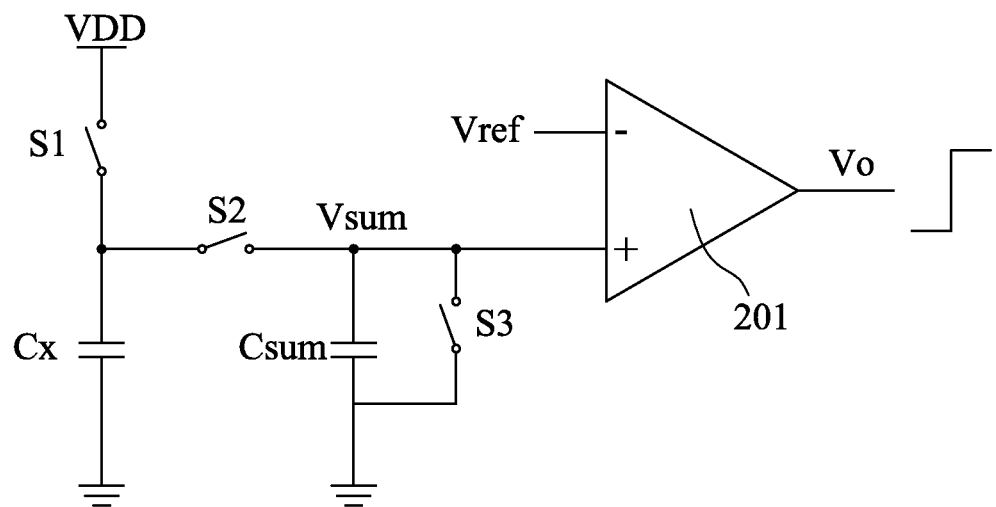
FIG. 2 shows a schematic view of a conventional circuit of using charge transfer to achieve capacitive sensing.
Figure 3:
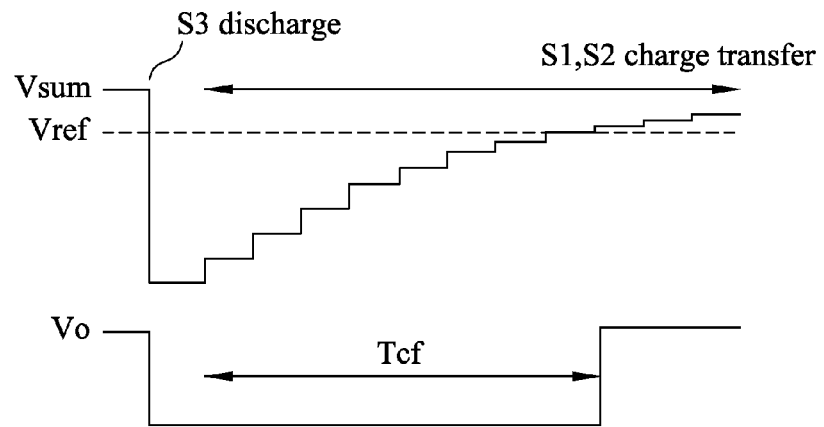
FIG. 3 shows a schematic view of a conventional capacitive sensing circuit computing the time Tcf from Csum discharging to Vo transition.
Figure 4:
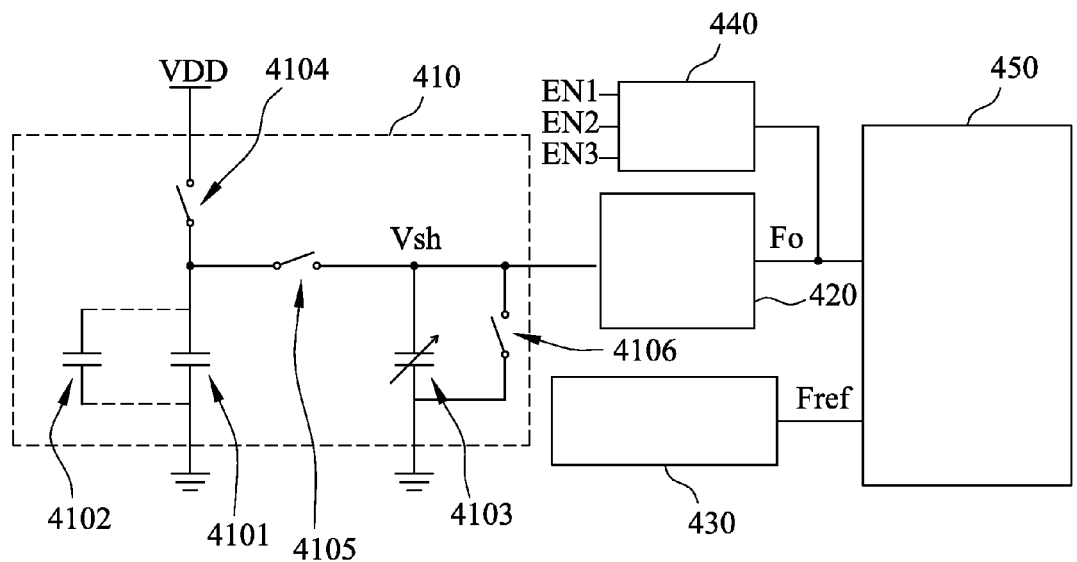
FIG. 4 shows a schematic view of an integratable capacitive touch sensing circuit through charge sharing according to the present invention.

FIG. 4 shows a schematic view of an integratable capacitive touch sensing circuit through charge sharing according to the present invention, including a charge sharing circuit 410, a voltage-controlled oscillator (VCO) 420, a reference frequency generator 430, a switch clock generator 440 and a frequency compare circuit 450; wherein the charge sharing circuit 410 further including a sensing capacitor 4101, a touch capacitor 4102, a share capacitor 4103, a charging switch 4104, a charge sharing switch 4105 and a discharging switch 4106, and sharing charge from the charged sensing capacitor 4101 with the discharged share capacitor 4103 through charge sharing to accumulate voltage on the share capacitor 4103; the touch capacitor 4102 being connected in parallel with the sensing capacitor 4101; the VCO 420 being coupled to the share capacitor 4103 of the charge sharing circuit 410 and generating an output frequency Fo having a linear relation to the capacitance of the sensing capacitor 4101 of the charge sharing circuit 410; the reference frequency generator 430 being to provide a reference voltage Fref; the switch clock generator 440 being coupled to the output end of VCO 420 and generating non-overlapping switch clocks according to the output Fo of the VCO 420 to control the charging switch 4104, charge sharing switch 4105 and discharging switch 4106 of the charge sharing circuit 410, wherein the charging switch 4104 being connected between an external voltage source VDD and the sensing capacitor 4101 to control the charging of the sensing capacitor 4101; the charge sharing switch 4105 being connected between the sensing capacitor 4101 and the non-grounded end of the charge sharing capacitor 4103 to control the charge sharing; and the discharging switch 4106 being connected in parallel with the charge sharing capacitor 4103 to control the discharging of the charge sharing capacitor 4103; and the frequency compare circuit 450 being coupled to the output end of the VCO 420 and the reference frequency provided by the reference frequency generator to count respectively the output frequency of the VCO and the reference frequency 430; when the output frequency Fo of the VCO 420 changing because of a finger touching, a touch event is detected.

It should be noted that in a general capacitive touch application, the capacitance Cx of the sensing capacitor 4101 of the charge sharing circuit 410 is within the range of 5-100 pF. Therefore, in the present embodiment, the capacitance Csh of the share capacitor 4103 can be designed to be within 5-100 pF so that different capacitance Csh can be adjusted depending on the Cx generated by different application. In addition, besides the sensing capacitance Cx and touch capacitance Cf, no large capacitance is required. Also external large capacitors are avoided so as to achieve the ability of integrating the circuit.

Figure 5:
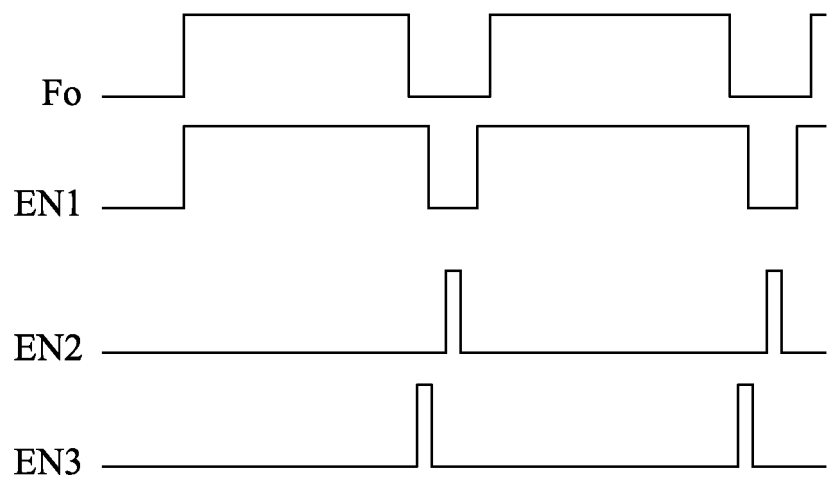
FIG. 5 shows a schematic view of the waveform of the switch enable signals of FIG. 4.

The operation of the charge sharing circuit 410 is described as follows: when output Fo is 1, the enable signal EN1 of the charging switch 4104 is 1. Therefore, the charging switch 4104 is closed. The enable signals EN2 and EN3 of the sharing switch 4105 and discharging switch 4106 are 0. Therefore, the sharing switch 4105 and discharging switch 4106 are open. In this situation, the sensing capacitor 4101 is charged to the VDD level. FIG. 5 shows a schematic view of the waveform of the switch enable signals of FIG. 4. As shown in FIG. 5, the Fo maintains at a high (1) level during the majority of its period. Before Fo transits from high (1) level to low (0) level, the enable signal EN3 of discharging switch 4106 becomes 1 and discharging switch 4106 is closed. After the share capacitor 4103 discharges to the ground level, Fo transits from high (1) level to low (0) level, and EN1=En3=0, thus, charging switch 4104 and the discharging switch 4106 are both open at the same time. Then, EN2=1, charge sharing switch 4105 is closed for sharing charge. After charge sharing is complete, EN2=0 and the charge sharing switch 4105 is open, followed by EN1=1 and charging switch 4104 is closed.

On the other hand, when Fo transits from low (0) level to high (1), EN1 maintains at 1 and the charging switch 4104 is closed. The close duration of the charge sharing switch 4105 and the discharging switch 4106 must be between 1/10-1/10000 of the cycle of Fo. The charging switch 4104 and the discharging switch 4106 are controlled by clock that is non-overlapping with the clock controlling the charge sharing switch 4105. The object of prolonging the close duration of the charging switch 4104 and minimizing the close duration of the charge sharing switch 4105 and the discharging switch 4106 is to reduce the interference of the ambient noise. Therefore, the charge sharing circuit 410 reduces the ambient noise interference by shortening the charge sharing time. The charge sharing circuit 410 only requires an Fo clock cycle to complete the charge sharing and immediately change the voltage Vsh after charge sharing depending on the presence of a finger touch. The next Fo clock cycle will also change according to the change of Vsh. As shown in FIG. 4, Fo and Vsh will change due to the touch of a finger. Furthermore, the voltage Vsh can be expressed as: Vsh=VDD*(Cx+Cf)/((Cx+

Cf)+Csh)). As shown in the above equation, Vsh is linear to the Cx and Cf. In other words, the sensing capacitance can be linearly translated into measured voltage.

The VCO 420 is a transformer depicting linear relation between output frequency and input voltage. The voltage Vsh generated through charge sharing can generate a linearly-related frequency through the VCO 420. In other words, through the conversion of voltage/frequency, the capacitance change can be measured. Without a finger touching, the capacitance is Cx. After sharing charge, the voltage Vsh is accumulated on the capacitor Csh. With a finger touching, the capacitance is Cx+Cf. After sharing charge, the voltage Vsh' is accumulated on the capacitor Csh. From the equation, it is known that Vsh'>Vsh. Then, After VCO 420, the corresponding frequency Fo' is also greater than Fo. The difference between Fo' and Fo can be determined by the frequency compare circuit 450 using the reference frequency Fref generated by reference frequency generator 430 as a base.

Figure 6:
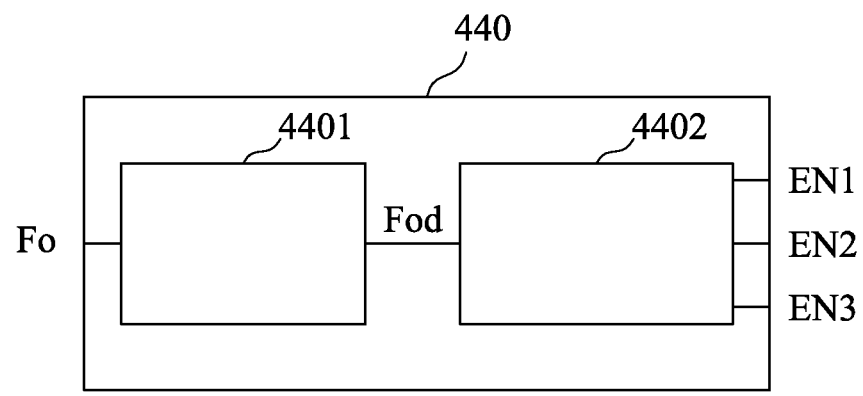
FIG. 6 shows a schematic view of the structure of the switch clock generator according to the present invention.
Figure 7:
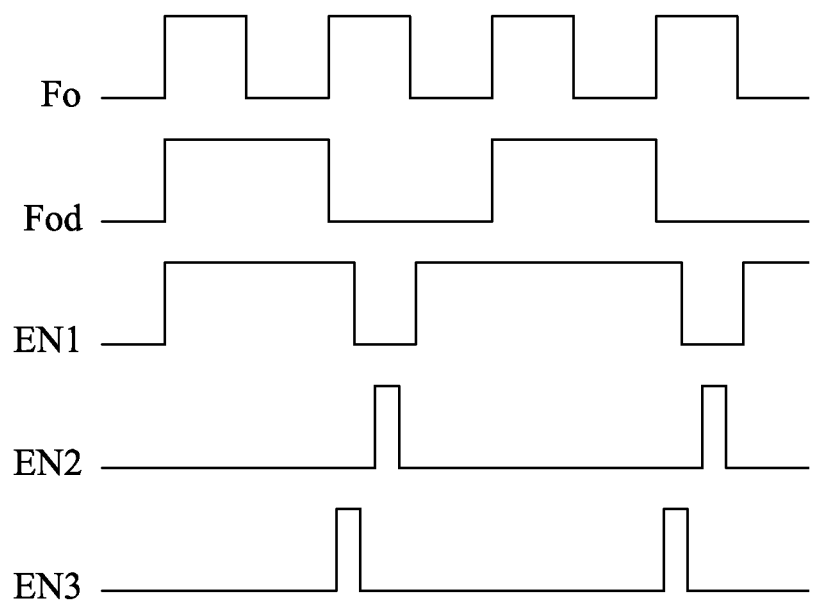
FIG. 7 shows an embodiment of the waveform of Fo, Fod, EN1, EN2 and EN3 generated by the switch clock generator according to the present invention.

FIG. 6 shows a schematic view of the structure of the switch clock generator according to the present invention. As shown in FIG. 6, the switch clock generator 440 further includes a frequency divider 4401 and a non-overlapping clock generator 4402. The function of the frequency divider 4401 is to reduce the number of charge sharing performed by the charge sharing circuit 410 from once per Fo cycle (frequency divider divided by 1) to once per N Fo cycles (frequency divider divided by N), with the frequency of VCO 420 remaining constant. As such, by using frequency divider at the switch clock generator, the entire circuit can achieve low energy-consumption in low-speed touch application while keeping the frequency of VCO constant. With the divided frequency Fod clock, the non-overlapping clock generator 4402 can generate the enable signals EN1, EN2, EN3 for controlling the charging switch 4104, charge sharing switch 4105 and discharging switch 4106, as well as achieving the object to prolong the close duration of the charging switch 4104 and minimizing the close duration of the charge sharing switch 4105 under the condition that the charge sharing can be complete. The discharging switch 4106 can minimize the close duration under the condition that the Csh can completely discharge to the ground level to achieve minimizing the ambient noise interference. In addition, the clock for the charge sharing switch 4105 and the clocks for the charging switch 4104 and discharging switch 4106 must be non-overlapping, wherein an embodiment of the waveforms of Fo, Fod, EN1, EN2, EN3 is as shown in FIG. 7 and the frequency divider is to divide-by-2.

As seen, the integratable capacitive touch sensing circuit through charge sharing can achieve the object of minimizing the ambient noise interference to better the application of capacitive touch sensing.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An integratable capacitive touch sensing circuit through charge sharing, comprising:
   a charge sharing circuit, further comprising a sensing capacitor and a share capacitor, and sharing charge from the charged sensing capacitor with the discharged share capacitor through charge sharing to accumulate voltage on the share capacitor;
   a voltage-controlled oscillator (VCO), coupled to the share capacitor of the charge sharing circuit and generating an output frequency having a linear relation to the capacitance of the sensing capacitor of the charge sharing circuit;
   a reference frequency generator, providing a reference voltage;
   a frequency compare circuit, coupled to the output end of the VCO and the reference frequency provided by the reference frequency generator to count respectively the output frequency of the VCO and the reference frequency; when the output frequency of the VCO changes because of a finger touching, a touch event is detected; and
   a switch clock generator, coupled to the VCO and generating non-overlapping switch clocks according to the output of the VCO.

2. The integratable capacitive touch sensing circuit as claimed in claim 1, wherein the share capacitor is a capacitor with adjustable capacitance to accommodate different touch applications which generate different sensing capacitances.

3. The integratable capacitive touch sensing circuit as claimed in claim 1, wherein the charge sharing circuit further comprises a touch capacitor, a charging switch, a charge sharing switch and a discharging switch; the touch capacitor is connected in parallel with the sensing capacitor; the charging switch is connected between an external voltage source and the sensing capacitor to control the charging of the sensing capacitor; the charge sharing switch is connected between the sensing capacitor and a non-grounded end of the charge sharing capacitor to control the charge sharing; and the discharging switch is connected in parallel with the charge sharing capacitor to control the discharging of the charge sharing capacitor.

4. The integratable capacitive touch sensing circuit as claimed in claim 3, wherein the switch clock generator is coupled to the output end of the VCO and generates non-overlapping switch clocks according to the output of the VCO to control the charging switch, charge sharing switch and discharging switch of the charge sharing circuit.

5. The integratable capacitive touch sensing circuit as claimed in claim 4, wherein the operation of the charge sharing circuit is as follows: when output of the VCO is 1, the enable signal of the charging switch is 1 and the charging switch is closed; the enable signals of the sharing switch and discharging switch are 0, and the sharing switch and discharging switch are open; in this situation, the sensing capacitor is charged to a level of an external voltage source level; when the output of the VCO transits from low level (0) to high (1) level, the enable signal of the charging switch remains 1 and the charging switch is closed; before the output of the VCO transits from high (1) level to low (0) level, the enable signal of discharging switch becomes 1 and discharging switch is closed; after the share capacitor discharges to the ground level, the output of the VCO transits from high (1) level to low (0) level, and the enabling signals of the charging switch and the discharging switch are both 0, and the charging switch and the discharging switch are both open at the same time; then, the enable signal of the charge sharing switch becomes 1 and the charge sharing switch is closed to share charge; after finishing sharing, the enable signal of the charge sharing switch is 0 and the charge sharing switch is open, followed by the enable signal of charging switch as 1 and the charging switch is closed.

6. The integratable capacitive touch sensing circuit as claimed in claim 5, wherein the charge sharing switch and the discharging switch must have a close duration between 1/10-1/10000 of the output cycle of the VCO.

7. The integratable capacitive touch sensing circuit as claimed in claim 5, wherein the charge sharing circuit only takes a clock cycle of the output of the VCO to complete sharing charge and immediately changes the voltage of the share capacitor after sharing charge; also, the next cycle of the output of the VCO will also change according to the change of the voltage of the share capacitor.

8. The integratable capacitive touch sensing circuit as claimed in claim 5, wherein the sensing capacitance can be linearly translated into measured voltage.

9. The integratable capacitive touch sensing circuit as claimed in claim 6, wherein the clocks controlling the charging switch, the discharging switch and the charge sharing switch are non-overlapping clocks.

10. The integratable capacitive touch sensing circuit as claimed in claim 6, wherein prolonging the close duration of charging switch and minimizing the close duration of the charge sharing switch and the discharging switch is to minimize interference from ambient noise.

11. The integratable capacitive touch sensing circuit as claimed in claim 5, wherein the charging switch is closed during the majority of a clock cycle.

12. The integratable capacitive touch sensing circuit as claimed in claim 1, wherein frequency compare circuit uses a reference frequency as a base, counting the difference in the output frequency of the VCO to determine whether a finger touching event is at presence.

13. The integratable capacitive touch sensing circuit as claimed in claim 1, wherein the switch clock generator further comprises a frequency divider and a non-overlapping clock generator.

14. The integratable capacitive touch sensing circuit as claimed in claim 13, wherein the frequency divider can reduce the number of charge sharing performed by the charge sharing circuit from once per cycle of the output of the VCO to once per N cycles of the output of the VCO, with the output of VCO remaining constant so that the entire circuit can achieve low energy-consumption in low-speed touch application.

* * * * *